(12) United States Patent  
JangJian et al.

(10) Patent No.: US 9,876,114 B2
(45) Date of Patent: Jan. 23, 2018

(54) STRUCTURE AND METHOD FOR 3D FINFET METAL GATE

(71) Applicant: Taiwan Semiconductor Manufacturing Company, Ltd., Hsin-Chu (TW)

(72) Inventors: Shiu-Ko JangJian, Hsin-Chu (TW); Chih-Nan Wu, Hsin-Chu (TW); Chun Che Lin, Hsin-Chu (TW); Ting-Chun Wang, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 14 days.

(21) Appl. No.: 14/687,447

(22) Filed: Apr. 15, 2015

(65) Prior Publication Data
US 2016/0190305 A1 Jun. 30, 2016

Related U.S. Application Data

(60) Provisional application No. 62/098,005, filed on Dec. 30, 2014.

(51) Int. Cl.
| H01L 27/088 | (2006.01) |
| H01L 21/70 | (2006.01) |
| H01L 21/3205 | (2006.01) |
| H01L 21/4763 | (2006.01) |
| H01L 29/78 | (2006.01) |
| H01L 29/66 | (2006.01) |
| H01L 21/8234 | (2006.01) |
| H01L 29/49 | (2006.01) |
| H01L 29/51 | (2006.01) |

(52) U.S. Cl.
CPC .... *H01L 29/785* (2013.01); *H01L 21/823456* (2013.01); *H01L 29/4966* (2013.01); *H01L 29/513* (2013.01); *H01L 29/6681* (2013.01); *H01L 29/66545* (2013.01); *H01L 29/66795* (2013.01)

(58) Field of Classification Search
CPC ............... H01L 29/785; H01L 29/7856; H01L 29/66795; H01L 29/823821; H01L 21/82385; H01L 21/28114; H01L 21/823456; H01L 21/823828; H01L 29/4958; H01L 29/66545
See application file for complete search history.

(56) References Cited

U.S. PATENT DOCUMENTS

| 7,667,271 B2 | 2/2010 | Yu et al. |
| 7,910,453 B2 | 3/2011 | Xu et al. |
| 8,362,575 B2 | 1/2013 | Kwok et al. |

(Continued)

FOREIGN PATENT DOCUMENTS

JP 2007080955 A 3/2007

*Primary Examiner* — Fernando L Toledo
*Assistant Examiner* — Aaron Gray
(74) *Attorney, Agent, or Firm* — Haynes and Boone, LLP

(57) ABSTRACT

The present disclosure provides a semiconductor structure in accordance with some embodiments. The semiconductor structure includes a semiconductor substrate; and a gate stack disposed on the semiconductor substrate; wherein the gate stack includes a high k dielectric material layer, and various metal layers disposed on the high-k dielectric material layer, wherein the gate stack has a convex top surface.

20 Claims, 17 Drawing Sheets

(56) References Cited

U.S. PATENT DOCUMENTS

| | | |
|---|---|---|
| 8,367,498 B2 | 2/2013 | Chang et al. |
| 8,377,779 B1 | 2/2013 | Wang |
| 8,399,931 B2 | 3/2013 | Liaw et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,796,759 B2 | 8/2014 | Perng et al. |
| 8,809,139 B2 | 8/2014 | Huang et al. |
| 8,816,444 B2 | 8/2014 | Wann et al. |
| 8,823,065 B2 | 9/2014 | Wang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 2008/0116503 A1* | 5/2008 | Tsurumi ............ H01L 21/28273 257/316 |
| 2008/0224238 A1* | 9/2008 | Kanakasabapathy ................... H01L 21/28088 257/411 |
| 2011/0068407 A1 | 3/2011 | Yeh et al. |
| 2011/0076844 A1* | 3/2011 | Heinrich ......... H01L 21/823425 438/595 |
| 2013/0011983 A1 | 1/2013 | Tsai et al. |
| 2013/0260549 A1 | 10/2013 | Jagannathan et al. |
| 2013/0273729 A1* | 10/2013 | Hempel .......... H01L 21/823807 438/592 |
| 2013/0328111 A1* | 12/2013 | Xie .......................... H01L 21/28 257/288 |
| 2014/0001574 A1 | 1/2014 | Chen et al. |
| 2014/0110755 A1 | 4/2014 | Colinge |
| 2014/0151812 A1 | 6/2014 | Liaw |
| 2014/0252412 A1 | 9/2014 | Tsai et al. |
| 2015/0060844 A1* | 3/2015 | Miyairi ............... H01L 29/7869 257/43 |
| 2015/0171084 A1* | 6/2015 | Lin ..................... H01L 27/0922 257/369 |
| 2016/0104704 A1* | 4/2016 | Fang .................. H01L 29/4966 257/392 |

* cited by examiner

STRUCTURE AND METHOD FOR 3D FINFET METAL GATE

This application claims the benefit of U.S. Provisional Application 62/098,005 entitled "STRUCTURE AND METHOD FOR 3D FINFET METAL GATE," filed Dec. 30, 2014, herein incorporated by reference in its entirety.

BACKGROUND

In advanced technology nodes of integrated circuit industry, high k dielectric material and metal are adopted to form a gate stack of a field-effect transistor (FET) such as a metal-oxide-semiconductor field-effect transistor (MOSFET). In existing methods to form the metal gate stack, metal gates are formed in a gate replacement process that removes dummy gates and fills in the gate trenches with gate materials. Due to high packing density and small feature sizes, it is challenging to achieve proper gap filling and profile control, especially for the FETs with 3D structure, such as 3D fin field effect transistors (FINFETs). Therefore, a structure of a metal gate stack and a method making the same are needed to address the issues identified above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
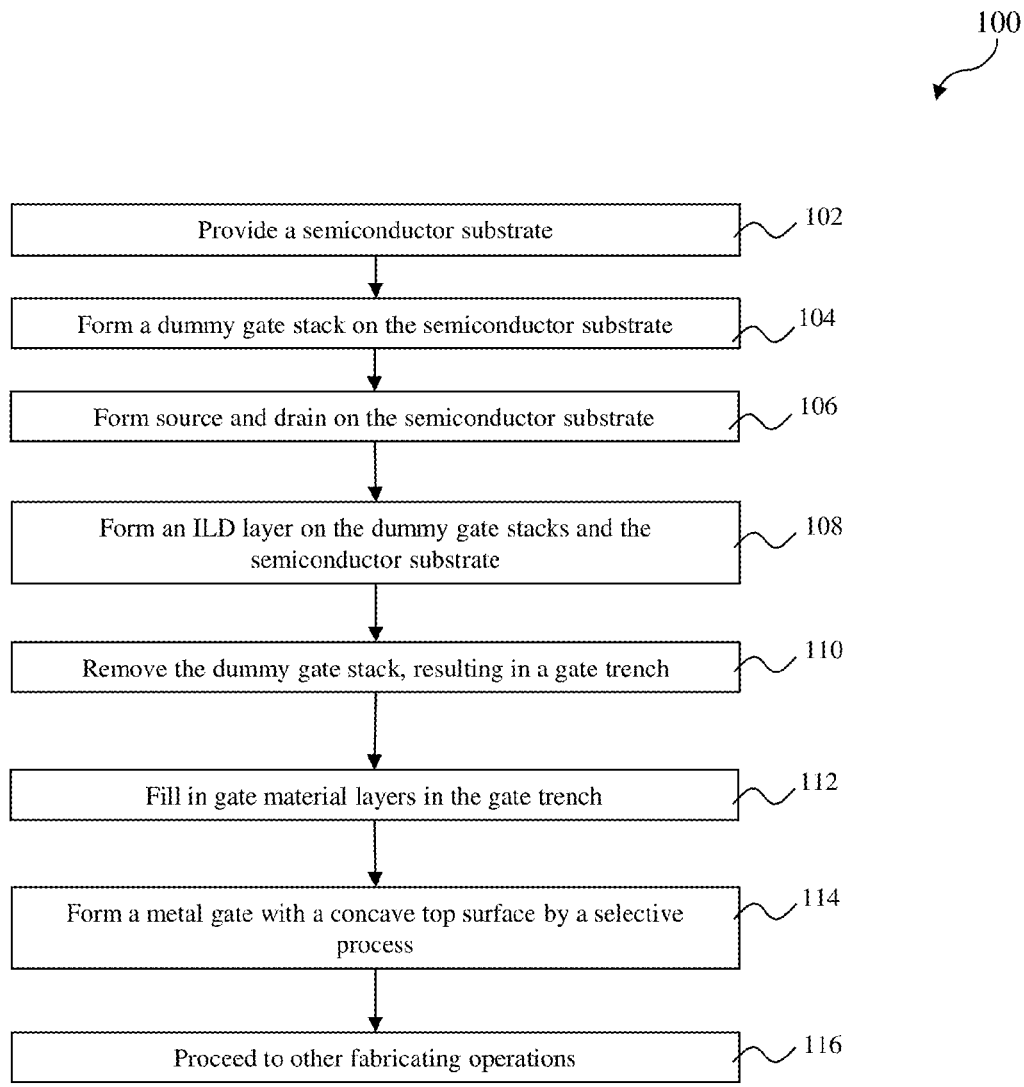
FIG. 1 is a flowchart of a method for making a semiconductor structure having a metal gate stack constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 11:
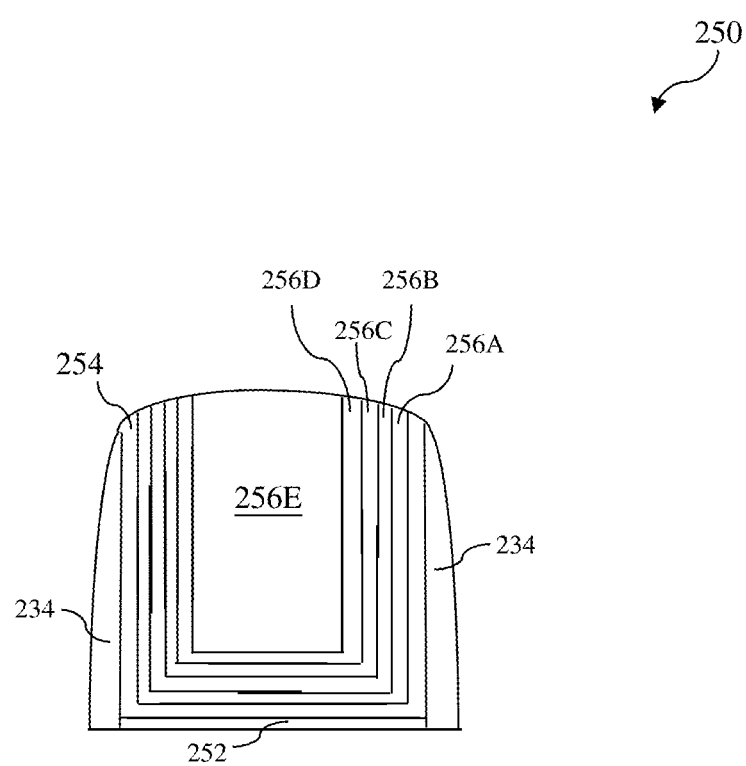
FIGS. 11 and 12 are sectional views of the gate stack of the semiconductor structure in FIG. 10 constructed in accordance with some embodiments.
Figure 12:
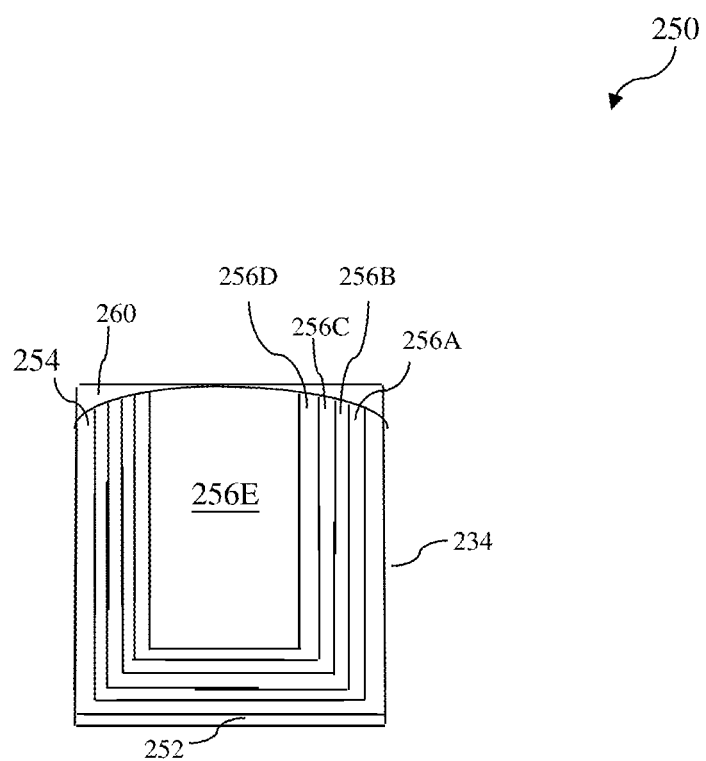

FIG. 1 is a flowchart of one embodiment of a method 100 making a semiconductor device having a gate stack constructed according to aspects of the present disclosure. FIGS. 2 and 3-10 are sectional views of a semiconductor structure 200 at various fabrication stages in accordance with some embodiments. FIGS. 11 and 12 are sectional views of the gate stack in the semiconductor structure 200 in accordance with some embodiments. FIGS. 3A-3C and 13A-13C illustrate a semiconductor structure 217 with a fin structure constructed in accordance with some other embodiments. The semiconductor structure 200 (or 217) and the method 100 of making the same are collectively described with reference to FIGS. 1 through 13.

The method 100 begins at 102 by providing a semiconductor substrate 210. The semiconductor substrate 210 includes silicon. Alternatively, the substrate 210 includes germanium or silicon germanium. In other embodiments, the substrate 210 may use another semiconductor material such as diamond, silicon carbide, gallium arsenic, GaAsP, AllnAs, AlGaAs, GaInP, or other proper combination thereof.

The semiconductor substrate also includes various doped regions such as n-well and p-wells formed by a proper technique, such as ion implantation. The semiconductor substrate 210 also includes various isolation features, such as shallow trench isolation (STI) features 212, formed in the substrate to define active regions 214 and separate various devices on the active regions. The formation of the STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to polish and planarize.

In some embodiments, the top surface of the semiconductor substrate 210 and the top surfaces of the STI features 212 are substantially coplanar, resulting in a common top surface. This is referred to as a planar structure. In other embodiments, the top surface of the semiconductor substrate 210 and the top surfaces of the STI features 212 are not coplanar, resulting in a three-dimensional structure, such as a fin structure 216 in a semiconductor structure 217 illustrated in FIG. 3A as a sectional view. In the semiconductor structure 217, the active region 214 is extended above the top surface of the STI features 212 and therefore is referred to as the fin structure or fin active region. Thus various devices are formed on the fin structure 216. Particularly, a field effect transistors (FET) is formed on the fin structure 216 and the corresponding gate of the FET is coupled with the channel from the multiple surfaces (top surface and sidewalls) of the fin structure, thus enhancing the device performance. Accordingly, the FET formed on the fin structure 216 is referred to as FinFET.

Figure 3A:
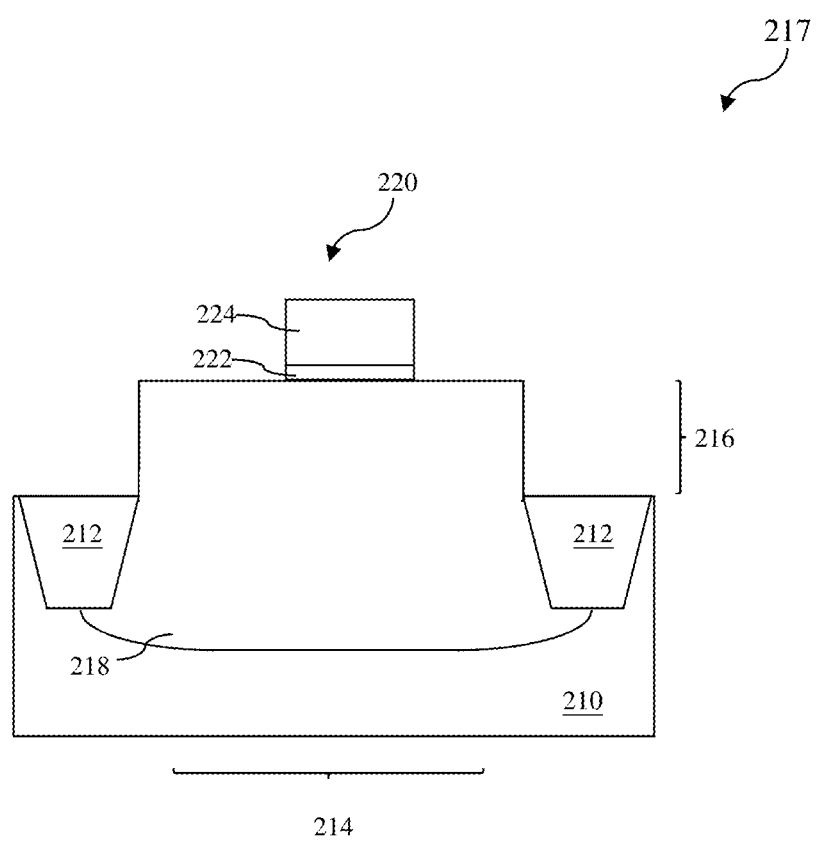
FIGS. 3A and 3C are sectional views of the semiconductor structure in FIG. 3B constructed in accordance with some embodiments.
Figure 3B:
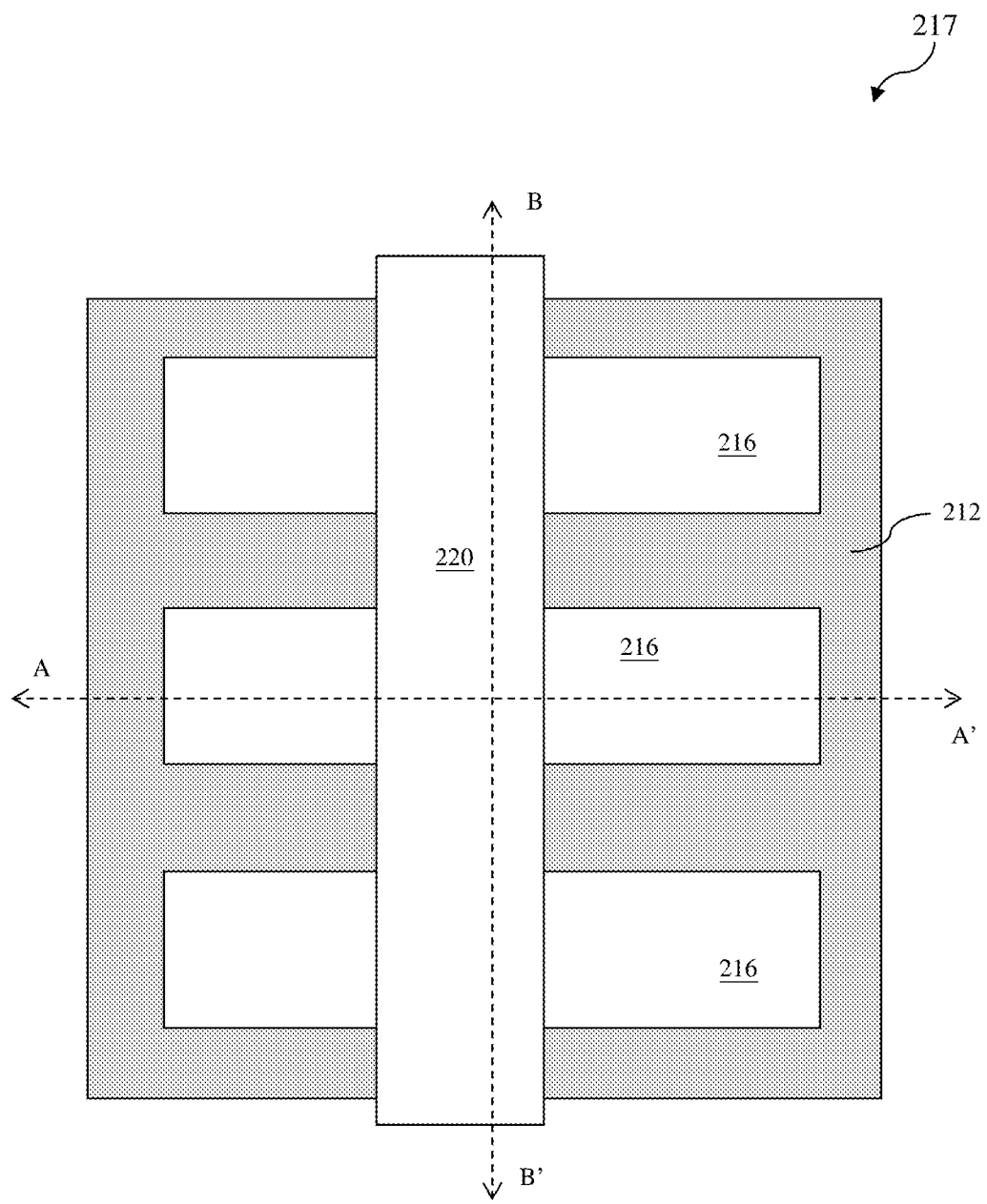
FIGS. 3B and 13B are top views of a semiconductor structure at various fabrication stages constructed in accordance with some embodiments.
Figure 3C:
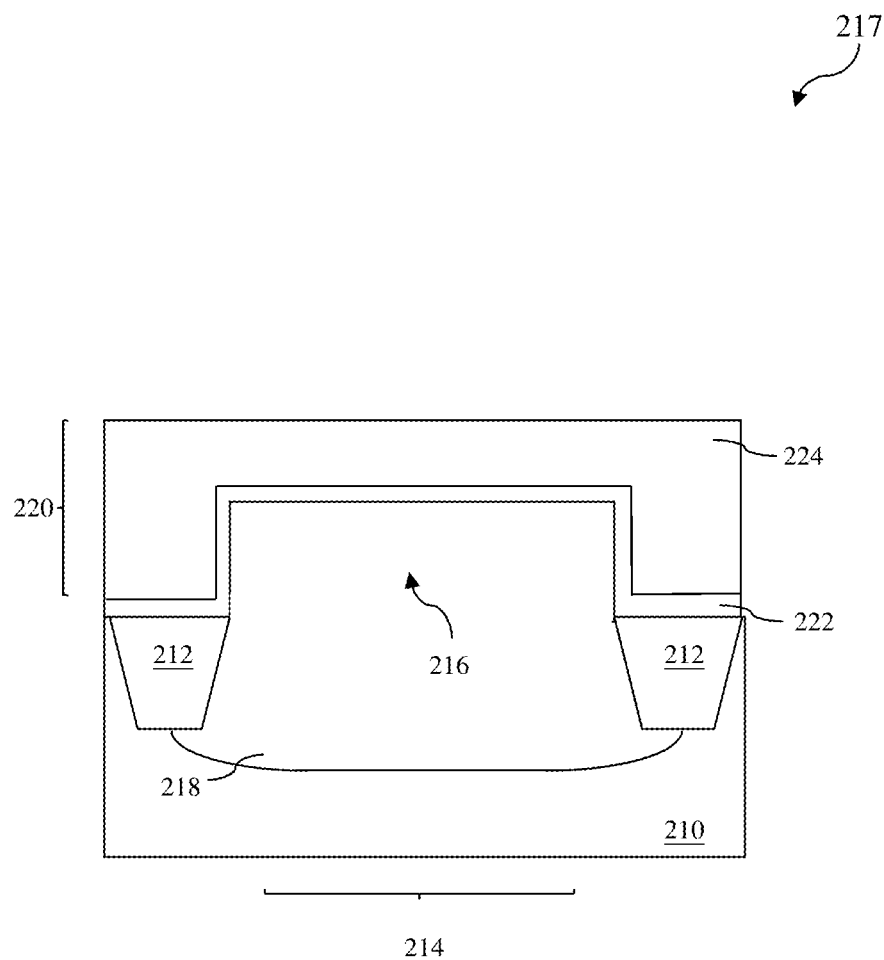

The semiconductor structure 217 is further described with reference to FIGS. 3B and 3C. FIG. 3B illustrates the semiconductor structure 217 in a top view, and FIG. 3C illustrates the semiconductor structure 217 in a sectional view along the dashed BB' in FIG. 3B, constructed in accordance with some embodiments. Accordingly, the semiconductor structure 217 in FIG. 3A is a sectional view along the dashed AA' in FIG. 3B.

Referring to FIG. 3B, the semiconductor structure 217 includes the fin structure 216 that defines the active region 214. The isolation features 212 are formed on the substrate 210 and define the fin structure 216. The active region 214 is defined in the fin structure 216. The fin structure 216 includes one or more finger features oriented in a first direction. A gate 220, which will be described later, is formed over the fin structure 216 and is oriented in a second direction different from the first direction. In a particular example, the first and second directions are orthogonal with each other.

Referring to FIG. 3C, the semiconductor structure 217 includes the fin structure 216 that defines the active region. The isolation features 212 are formed on the substrate 210 and define the fin structure 216. The fin structure 216 is extended above the top surface of the isolation features 212.

The disclosed semiconductor structure (200 or 217) and the method 100 making the same provide improvements to integrated circuits, especially to the FinFET. The fin structure 216 may be formed by various techniques. In some embodiments, the fin structure 216 is formed by recessing the STI features 212, such as by selective etching. In some other embodiments, the fin structure 216 is formed by selective epitaxy growth (SEG). In the SEG process, the fin structure 216 is formed with a semiconductor material same to that of the substrate 210 (such as silicon) or different (such as silicon germanium or silicon carbide) to further achieve other functions (e.g., straining effect). The method 100 is applicable to the planar semiconductor structure 200 and the non-planar semiconductor structure 217. The most figures below still use planar structure to describe the method 100 for simplicity.

Referring back to FIG. 2 (FIGS. 3A, 3B and 3C as well), a doped well 218 may be formed in one or more active region 214. In some embodiments, the active region 214 is designed to form a FET, such as a p-type FET (pFET) or an n-type FET (nFET). In some examples, a pFET is to be formed on the active region 214, and the doped well 218 includes an n-type dopant, such as phosphorous (P). In some other examples, an nFET is to be formed on the active region 214, and the doped well 218 includes a p-type dopant, such as boron (B), distributed in an active region. The dopant may be introduced to the doped well 218 through an opening of the mask layer by a suitable doping process, such as one or more ion implantation. The STI features 212 further functions to define the dopants to the desired active regions. In some embodiments, both nFETs and pFETs are formed the substrate 210, such as in complimentary metal-oxide-semiconductor (CMOS) circuits.

Figure 2:
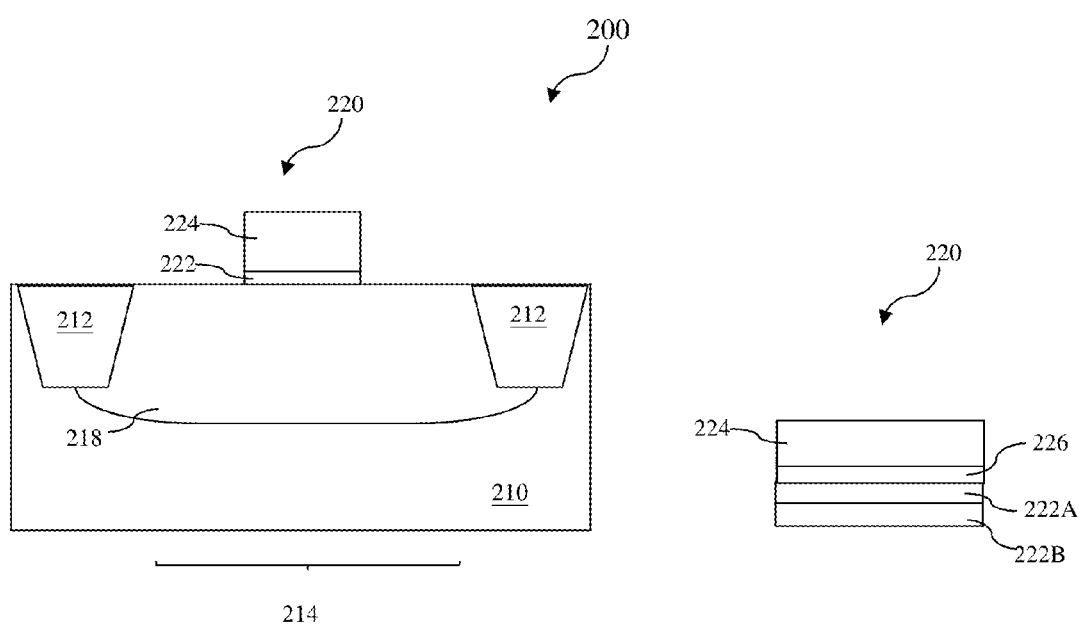
FIGS. 2 and 4 to 10 are sectional views of a semiconductor structure at various fabrication stages constructed in accordance with some embodiments.

Still referring to FIG. 2, the method 100 proceeds to an operation 104 by forming one or more dummy gate stack 220 on the semiconductor substrate 210. The gate stack 220 includes a gate dielectric layer 222 and a gate conductive layer 224. The formation of the gate stack 220 includes deposition and patterning. The patterning further includes lithography process and etching. A hard mask layer may be further used to pattern the gate stack 220.

In some embodiments as illustrated on the left of FIG. 2 with more details, the gate dielectric layer 222 includes a high k dielectric material layer 222A formed on the semiconductor substrate 210. A capping layer 226 may be formed on the gate dielectric layer 222. A polysilicon layer as the gate conductive layer is formed on the capping layer 226. The gate dielectric layer 222 may further include an interfacial layer (IL) 222B interposed between the semiconductor substrate 210 and the high k dielectric material layer 222A.

In furtherance of the embodiments, the interfacial layer 222B is formed on the substrate 210 before forming the high k dielectric material layer 222A. The interfacial layer 222B may include silicon oxide formed by a proper technique, such as an atomic layer deposition (ALD), thermal oxidation or UV-Ozone Oxidation. The interfacial layer may have a thickness less than 10 angstrom.

The high-k dielectric layer 222A includes a dielectric material having the dielectric constant higher than that of thermal silicon oxide, about 3.9. The high k dielectric layer 222A is formed by a suitable process such as ALD. Other methods to form the high k dielectric material layer include metal organic chemical vapor deposition (MOCVD), physical vapor deposition (PVD), UV-Ozone Oxidation or molecular beam epitaxy (MBE). In one embodiment, the high k dielectric material includes HfO2. Alternatively, the high k dielectric material layer 222A includes metal nitrides, metal silicates or other metal oxides.

The capping layer 226 is formed on the high k dielectric material layer 222A. In one embodiment, the capping layer 226 includes titanium nitride (TiN). In another example, the thickness of the titanium nitride layer ranges between about 5 angstrom and about 20 angstrom. The capping layer 226 may alternatively or additionally include other suitable materials. The capping layer 226 is formed by a proper technique, such as PVD.

The polysilicon layer 224 is formed on the capping layer 226. The polysilicon layer 224 is formed by a proper technique, such as CVD. In one example, the polysilcion layer 224 is non-doped. In another example, the polysilicon layer 224 has a thickness between about 500 angstrom and about 1000 angstrom.

A patterned mask may be further formed on the multiple gate material layers and is used as a mask to form the gate stack 220. The patterned mask is formed on the polysilicon layer 224. The patterned mask defines various gate regions and various openings exposing the gate stack material layers to be removed. The patterned mask includes a hard mask, such as silicon nitride and/or silicon oxide, or alternatively photoresist. In one embodiment, the patterned mask layer includes a patterned hard mask layer with silicon nitride and silicon oxide. As one example, a silicon nitride layer is deposited on the polysilicon layer by a low pressure chemical vapor deposition (LPCVD) process. The silicon nitride and silicon oxide layers are further patterned using a photolithography process to form a patterned photoresist layer and an etching process to etch the silicon oxide and silicon nitride within the openings of the patterned photoresist layer. Alternatively, other dielectric material may be used as the patterned hard mask. For example, silicon oxynitride may be used as the hard mask. In another embodiment, the patterned mask layer includes a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint.

The method includes patterning the gate material layers. One or more etching process is applied to the gate material layers through the openings of the patterned mask. The etching process may include dry etching, wet etching or a combination thereof, In other examples, the etching process may include multiple steps to effectively etch various gate material layers.

In some other embodiments, such as in a high-k last process, the high-k dielectric layer is not formed in the dummy gate stack 220. In this case, the gate dielectric layer 222 includes silicon oxide and the gate conductive layer 224 includes polysilicon. The deposition and patterning processes are similar to those described above.

Similarly, the gate stack 220 is formed on the fin structure 216 of the semiconductor structure 217 in FIGS. 3A-3C. Particularly, as illustrated in FIG. 3C, the gate stack 220 is disposed over the fin structure 216 and is extended to the isolation features 212. Since the top surface of the fin structure 216 and the top surface of the isolation features 212 are not coplanar, the portion of the gate stack 220 disposed on the fin structure 216 and the portion of the gate stack 220 disposed on the isolation features 212 have respective bottom surfaces at different levels (or not coplanar in other words).

Figure 4:
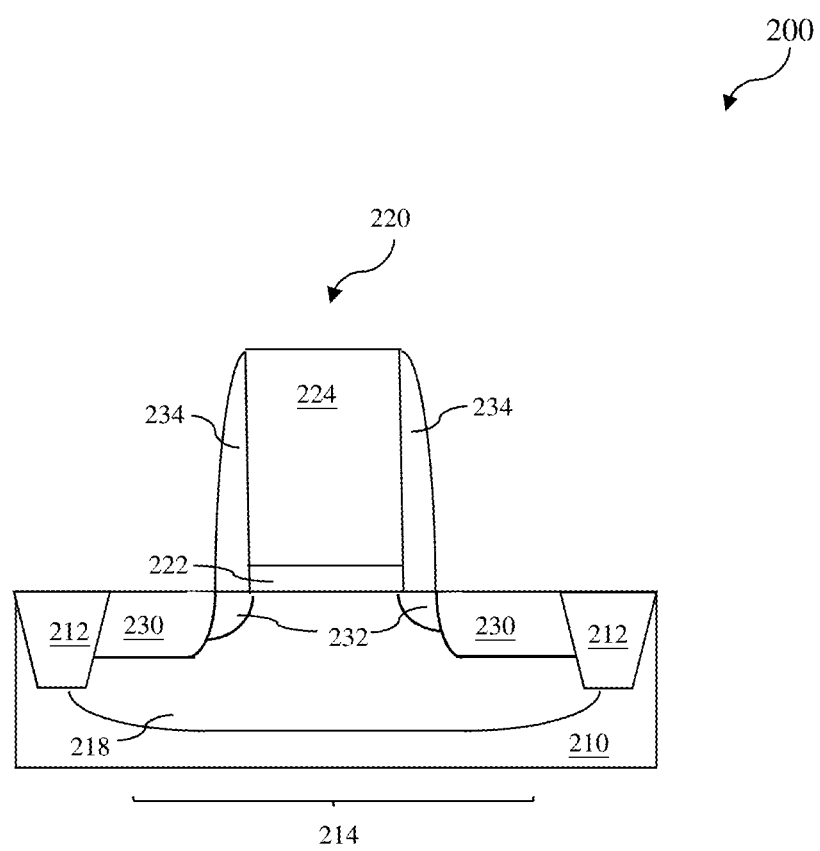

Referring to FIG. 4, the method 100 includes an operation 106 to form source and drain 232 in the substrate 210. In the operation 106, a gate spacer 232 may be formed on the sidewall of the gate stack 220. The source and drain (S/D) 230 are formed on the substrate 210 and interposed by the gate stack 220.

In yet another embodiment, the semiconductor structure 200 may further include light doped drain (LDD) features 232 formed on the substrate 210 with the same type conductivity and a lower doping concentration. The LDD features 232 and S/D 230 are formed respectively ion implantation. One or more thermal annealing process is followed to activate the doped species.

The gate spacer 232 includes one or more dielectric material, such as silicon oxide, silicon nitride, silicon oxynitride or combinations thereof. In one embodiment, the gate spacer 232 includes a seal spacer disposed on the sidewall of the gate stack and a main spacer disposed on the seal spacer, which are formed respectively by a procedure including deposition and etch.

In some examples, the source and drain 230 include doped doping species introduced to the semiconductor substrate 210 by a proper technique, such as ion implantation. In one embodiment, the gate stack 220 is configured in the active region for a n-type field effect transistor (nFET), the dopant of the source and drain is n-type dopant, such as phosphorus or arsenic. In another embodiment, the gate stack is configured in the active region for a p-type field effect transistor (pFET), the dopant of the source and drain is p-type dopant, such as boron or gallium. In yet another embodiment, the source and drain 230 include light doped drain (LDD) features and heavily doped source drain (S/D) features, collectively referred to as source and drain. The LDD features and S/D features are formed respectively ion implantation. One or more thermal annealing process is followed to activate the doped species.

Figure 5:
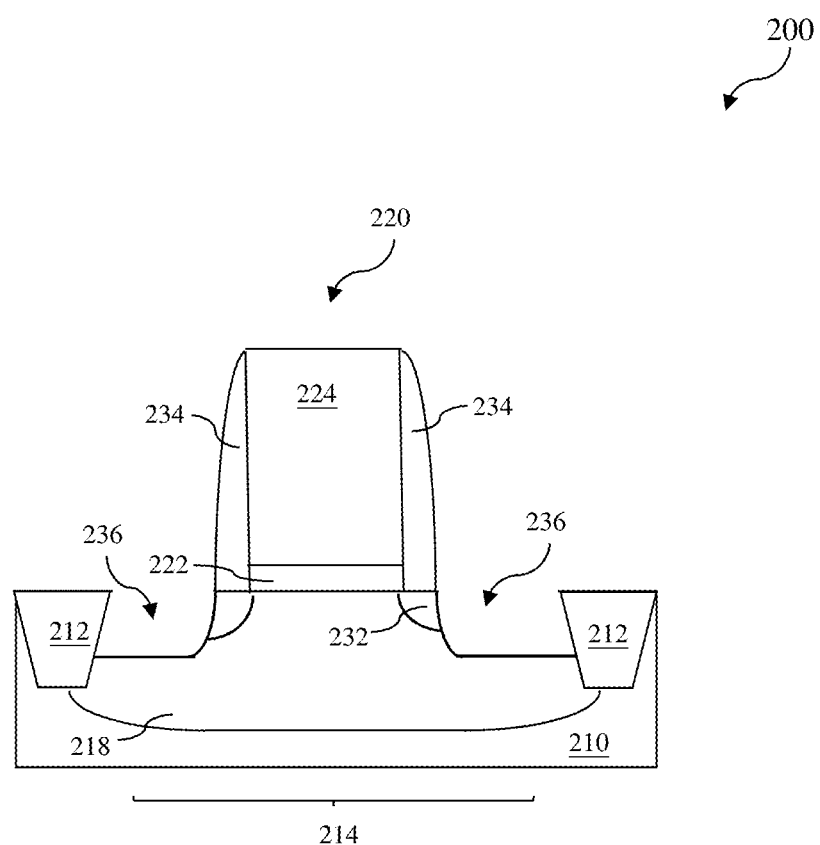

In some embodiments, the source and drain 230 are formed by epitaxy growth to enhance device performance, such as for strain effect to enhance mobility. In furtherance of the embodiments, the formation of the source and drain 230 includes selectively etching the substrate 210 to form the recesses 236 as illustrated in FIG. 5; and eptaxy growing a semiconductor material in the recesses 236 to form the source and drain 230 (such as those illustrated in FIG. 4). The recesses 236 may be formed using wet and/or dry etch process to selectively etch the material of the substrate 210.

In furtherance of the embodiments, the gate stack 220, the gate spacers 234, and the STI 212 collectively function as an etching hard mask, thereby forming the recesses 236 in the source and drain regions. In some examples, an etchant such as carbon tetrafluoride (CF4), tetramethylammonium hydroxide (THMA), other suitable etchant, or a combination thereof is used to form the recesses 236.

Thereafter, the recesses 132 are filled with a semiconductor material by epitaxially growing source and drain (S/D) features 230 in crystalline structure. The epitaxy growth may include in-situ doping to form S/D with proper dopant. In some embodiments, the epitaxy growth is a selective deposition process that involves etching during the epitaxy growth, such that the semiconductor material is substantially grown on the semiconductor surfaces in the recess 236. Particularly, the selective deposition process involves chlorine for etching effect and makes the deposition selective. The selective deposition process is designed and tuned to epitaxially grow such that the S/D 230 formed in the recesses 236 include the semiconductor material in a crystalline structure. The semiconductor material is different from that of the substrate 210. For example, the semiconductor material includes silicon carbide or silicon germanium while the substrate 210 is a silicon substrate. In some embodiments, the semiconductor material is chosen for proper strained effect in the channel region such that the corresponding carrier mobility is increased. In one example, the active region 214 is for a pFET, the semiconductor material is silicon germanium doped with boron for S/D 230 while the substrate 210 is a silicon substrate. In another example, the active region 214 is for an nFET, the semiconductor material is silicon carbide doped with phosphorous for S/D 230 while the substrate 210 is a silicon substrate.

In yet another embodiment, silicide features may be further formed on the source and drain regions to reduce the contact resistance. The silicide features may be formed by a technique referred to as self-aligned silicide (salicide) including metal deposition (such as nickel deposition) onto a silicon substrate, a thermal anneal to react the metal with silicon to form silicide, and an etch to removed un-reacted metal.

Figure 6:
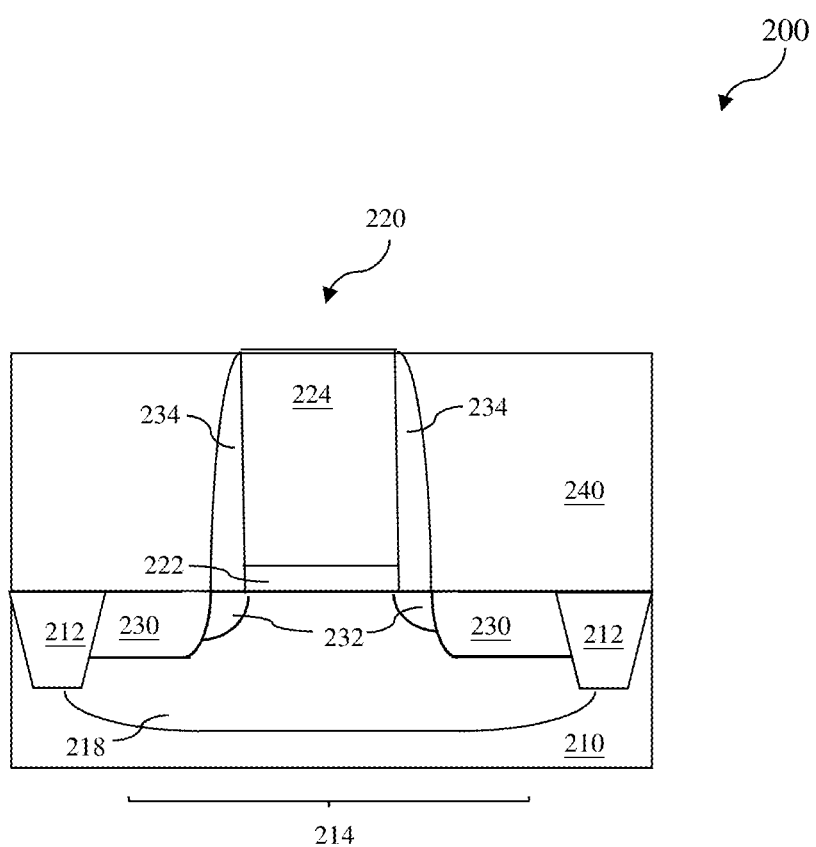

Referring to FIG. 6, the method 100 proceeds to an operation 108 by forming an interlayer dielectric (ILD) 240 on the substrate and the gate stack 220. The ILD 240 is deposited by a proper technique, such as CVD. The ILD 240 includes a dielectric material, such as silicon oxide, low k dielectric material or a combination. Then a chemical mechanical polishing (CMP) process may be applied thereafter to polarize the surface of the ILD 240. In one example, the gate stack is exposed by the CMP process for the subsequent processing steps. In another example that the hard mask to pattern the gate stack 220 is not removed at the previous operation, the CMP removes the hard mask as well. Alternatively the CMP stops on the hard mask and the hard mask is removed thereafter by an etch process.

Figure 7:
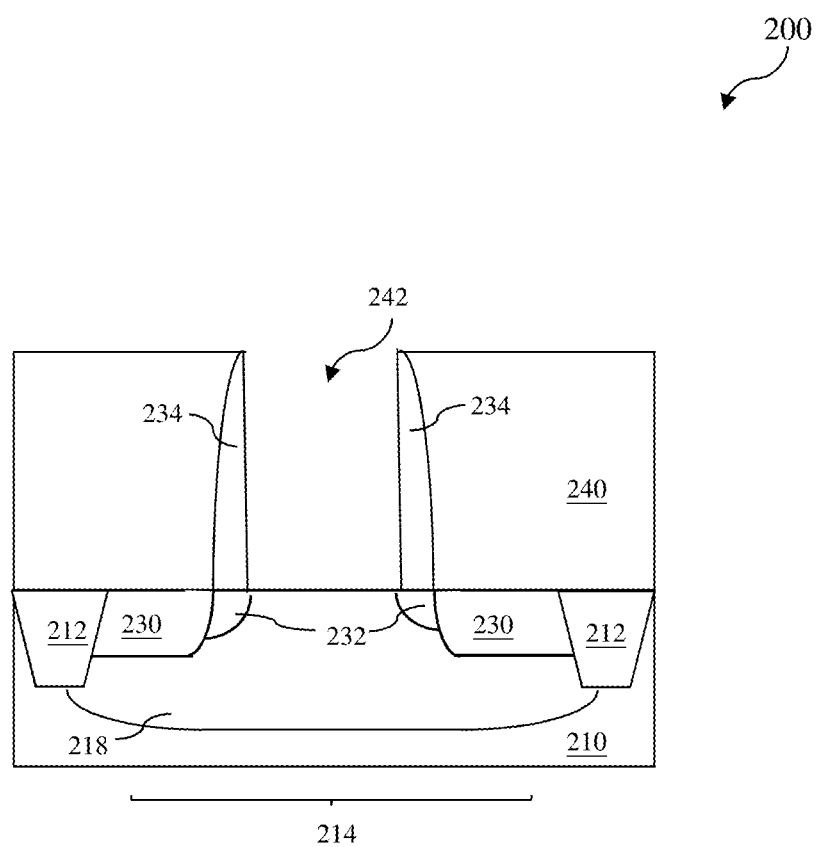

Referring to FIG. 7, the method 100 proceeds to an operation 110 by removing the gate stack 220 partially or completely, resulting in a gate trench 242. The operation 110 includes one or more etching steps to selectively remove the gate conductive layer 224 or alternatively the gate stack 220 by a suitable etching process, such as one or more wet etch, dry etch or a combination.

Figure 8:
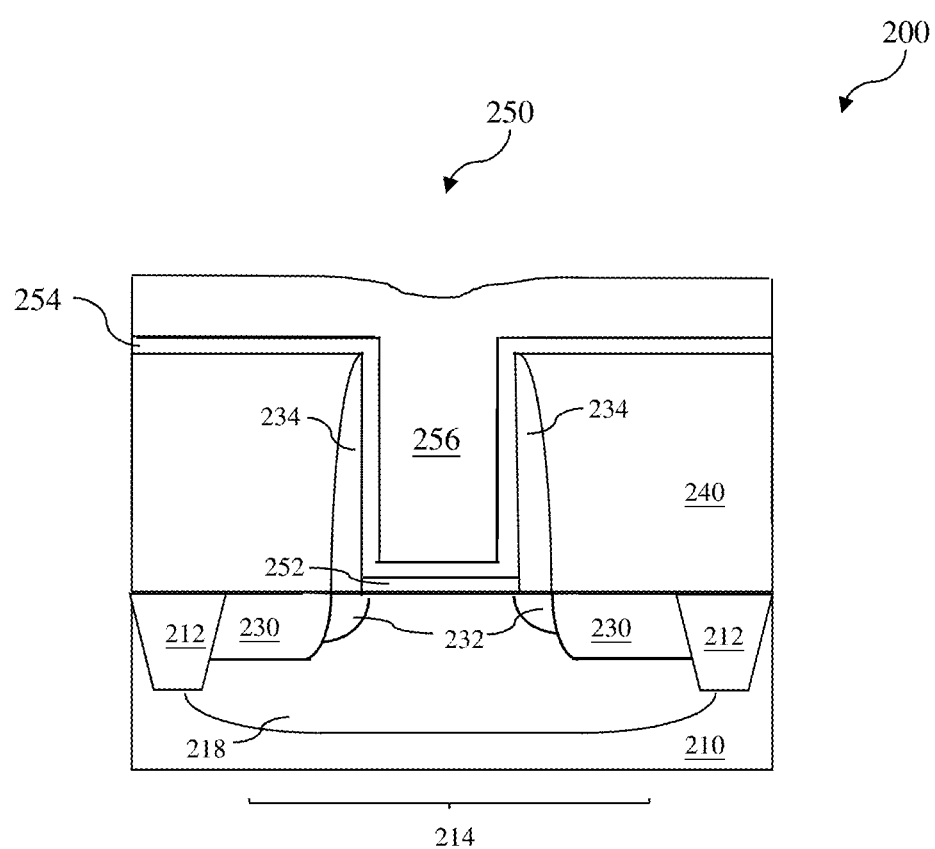

Referring to FIG. 8, the method 100 proceeds to an operation 112 by filling various gate material layers in the gate trench 242, forming a metal gate 250 in the gate trench 242. In some embodiments such as in high-k last process, the gate material layers includes a gate dielectric layer 254 and a gate conductive layer (or gate electrode) 256. The gate dielectric layer 254 includes a high-k dielectric material. The gate conductive layer 256 includes metal. In some embodiments, the gate conductive layer 256 include multiple layers, such as a capping layer, a work function metal layer, a blocking layer and a filling metal layer (such as aluminum or tungsten). The gate material layers may further include an interfacial layer 252, such as silicon oxide, interposed between the substrate 210 and the high-k dielectric material. The interfacial layer 252 is a portion of the gate dielectric layer. The various gate material layers are filled in the gate trench 242 by deposition, such as CVD, PVD, plating, ALD or other suitable techniques.

The high-k dielectric layer 252 includes a dielectric material having the dielectric constant higher than that of thermal silicon oxide, about 3.9. The high k dielectric layer 252 is formed by a suitable process such as ALD. Other methods to form the high k dielectric material layer include MOCVD, PVD, UV-Ozone Oxidation or MBE. In one embodiment, the high k dielectric material includes HfO2. Alternatively, the high k dielectric material layer 252 includes metal nitrides, metal silicates or other metal oxides.

In one embodiment illustrated in FIG. 11 in a sectional view, the gate electrode 256 includes a capping layer 256A, a blocking layer 256B, a work function metal layer 256C, another blocking layer 256D and a filling metal layer 256E. In furtherance of the embodiments, the capping layer 156A includes titanium nitride, tantalum nitride, or other suitable material, formed by a proper deposition technique such as ALD. The blocking layer 256B includes titanium nitride, tantalum nitride, or other suitable material, formed by a proper deposition technique such as ALD.

The work functional metal layer 256C includes a conductive layer of metal or metal alloy with proper work function such that the corresponding FET is enhanced for its device performance. The work function (WF) metal layer 256C is different for a pFET and a nFET, respectively referred to as an n-type WF metal and a p-type WF metal. The choice of the WF metal depends on the FET to be formed on the active region 214. For example, the semiconductor structure 200 includes a first active region 214 for an nFET and another active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WK metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher.

In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

The blocking layer 256D includes titanium nitride, tantalum nitride, or other suitable material, formed by a proper deposition technique such as ALD. In various embodiments, the filling metal layer 256E includes aluminum, tungsten or other suitable metal. The filling metal layer 256E is deposited by a suitable technique, such as PVD or plating.

Figure 9:
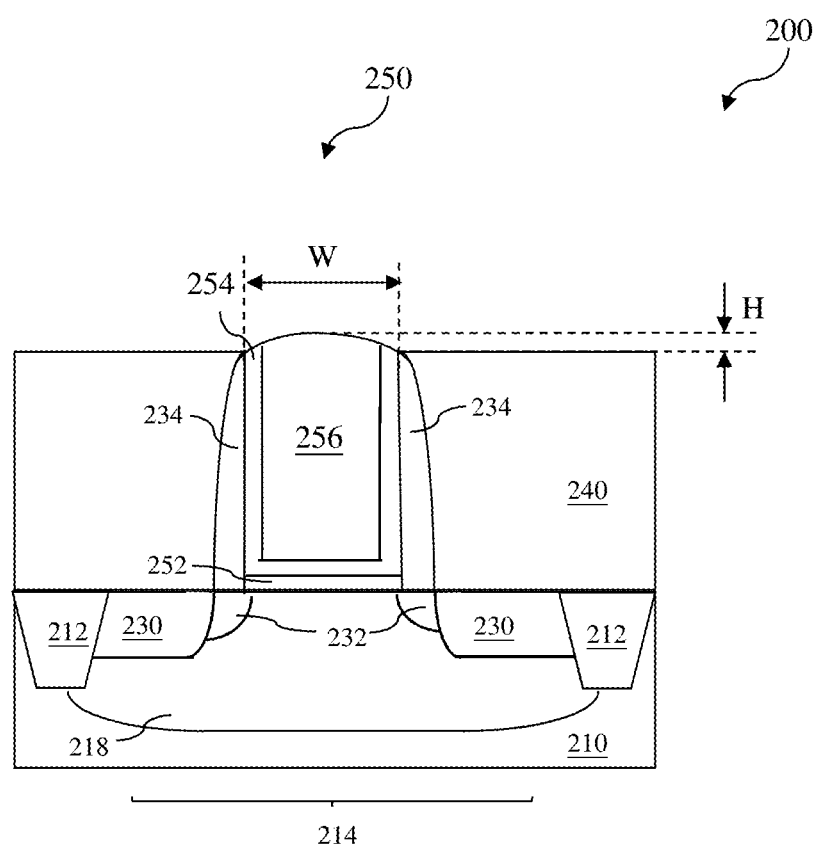

Referring to FIG. 9, the method 100 includes an operation 114 by forming the metal gate 250 having a convex top surface. After the operation 112, the gate material layers are substantially filled in the gate trench 242 and may also be deposited on the ILD layer 240. The operation 114 removes gate materials deposited on the ILD layer 240 and is designed to form the convex top surface of the gate stack 250. This is achieved by a selective removing process that has different removal rates of various gate materials. Particularly, the selective removing process has higher removal rates to the edge gate material layers (such as high-k dielectric material and the capping layer) and lower removal rates to the central gate material layers (such as the filling metal layer). Particularly, the selective removing process has selective removal rates such that from edge metal layers to the central metal layers the removal rate is decreasing.

In some embodiments, the selective removing process is a selective CMP process. The CMP process is applied to remove the excessive gate materials, such as the metals disposed on the ILD 240. The selective CMP process is designed to have selective removal rates to form the convex top surface. In some examples, the slurry used in the selective CMP process is designed to include proper chemicals to achieve such polishing selectivity. In some other examples, the slurry used in the selective CMP process is designed to include chemical with etching selectivity, grinding particles with proper sizes, proper polishing pressure, multiple polishing steps for polishing selectivity, or a combination thereof.

In some embodiments, the selective CMP process includes a first CMP step and a second CMP step. The first CMP step includes first slurry, first pressure and first polishing duration. The second CMP step includes second slurry, second pressure and second polishing duration. The second slurry, the second pressure and the second polishing duration are different from the first slurry, the first pressure and the first polishing duration, respectively, or one of them (slurry, pressure or polishing duration) is different. The two CMP steps are designed with polishing selectivity such that the edge gate material is removed more that the central gate material is removed. In one example, the first CMP step, with the first slurry and the first pressure, is designed to substantially remove the edge gate material relative to the central gate material; and the second CMP step, with the second slurry and the second pressure, is designed to substantially remove the central gate material relative to the edge gate material. The first polishing duration in the first CMP step is greater than the second polishing duration in the second CMP step. Thereby, more edge gate material is removed and the convex surface of the gate 250 is formed. In furtherance of the embodiments, the first slurry and the second slurry are different from each other in terms of the etching chemicals and the grinding particles in the corresponding slurry.

In some embodiments, the selective removing process is a selective etching process. The selective etching process is applied to remove the excessive gate materials, such as the metals disposed on the ILD 240. The selective etching process is designed to have selective removal rates to form the convex top surface. In some examples, the etchant used in the selective etching process is chosen to have such etching selectivity. In some other examples, the etchant includes F2, Cl2, BCl3 or a mixing thereof. In some other embodiments, the selective etching process includes a first etching step and a second etching step. The first etching step includes a first etchant designed to selectively etch the edge gate material and the second etching step includes a second etchant. The second etchant is different from the first etchant and is designed to selectively etch the central gate material. For example, the first etchant includes hydrofluoric (HF) solution to selectively remove the gate dielectric material and the second etchant includes H3PO4, HNO3, HCl or a combination thereof. In furtherance of the example, the HF solution uses non-aqueous solvent to reduce the removal of the ILD layer 240. The first and second etching steps are controlled, such as by controlling etching times, to form the convex profile of the gate 250.

In some other embodiments, the selective removing process includes a combination of CMP and etching optimized to form the convex top surface. For example, the removing process includes a CMP process and thereafter a selective etching process. The CMP process substantially removes the excessive gate materials above the ILD layer. The selective etching process (such as HF solution) is designed to selectively remove the gate dielectric material.

Thus formed gate stack 250 has a convex top surface. The height difference of the gate stack 250 from the center to the edge is H and the gate width is W. In some examples, the height difference H ranges from about 2 nm to about 10 nm. In some embodiments, the ratio H/W ranges from about 10% to about 50%.

Figure 10:
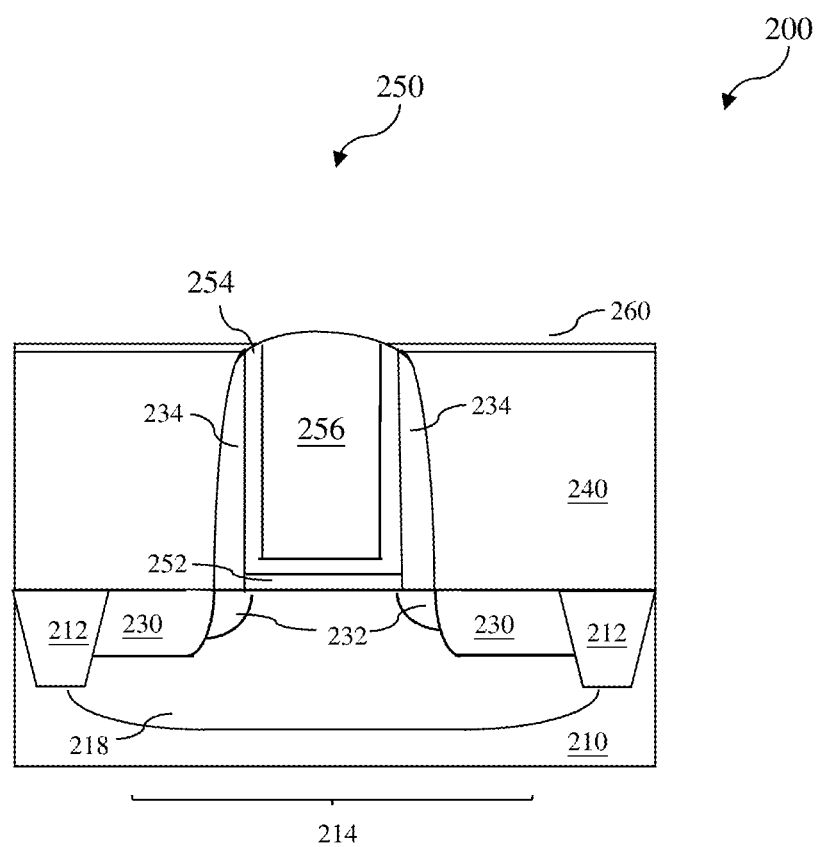

Referring to FIGS. 1 and 10, the method 100 includes other fabrication operation 116. In the present embodiment, the operation 116 includes a procedure to form a capping layer 260 on the substrate 210. In one example, the formation of the capping layer 260 includes deposition and polishing. In furtherance of the example, a capping layer 260 of a dielectric material is deposited on the substrate by a proper technique, such as CVD. The dielectric material of the capping layer 260 includes a proper material, such as silicon oxide, silicon nitride, low-k dielectric material or other suitable dielectric material. The polishing process may be a CMP process. After the CMP process, the top surface of the semiconductor structure 200 is planarized. Particularly, as illustrated in FIG. 12, the capping layer is disposed on the top surface of the gate stack 250 in the edge areas, thus providing protection to the gate stack 250 from chemical damages or other damages during the subsequent fabrication processes, such as chemical attacking from sidewalls. The capping layer 260 functions as a barrier layer. For example, during following operation to form contacts, chemical etching is evolved to open the subsequently formed ILD layer. The etching chemical may further etch to the gate stack 250 from the sidewalls and thereby damage it. With the protection of the capping layer 260, the gate stack 250 is protected and is therefore damage free.

Figure 13A:
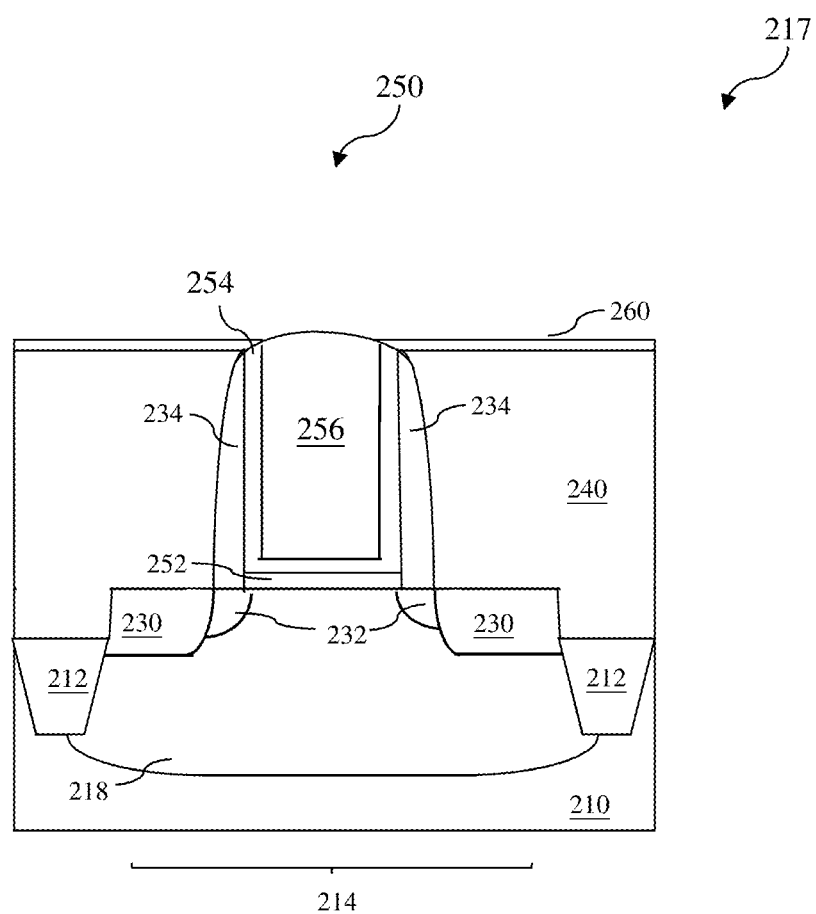
FIGS. 13A and 13C are sectional views of the semiconductor structure in FIG. 13B constructed in accordance with some embodiments.
Figure 13B:
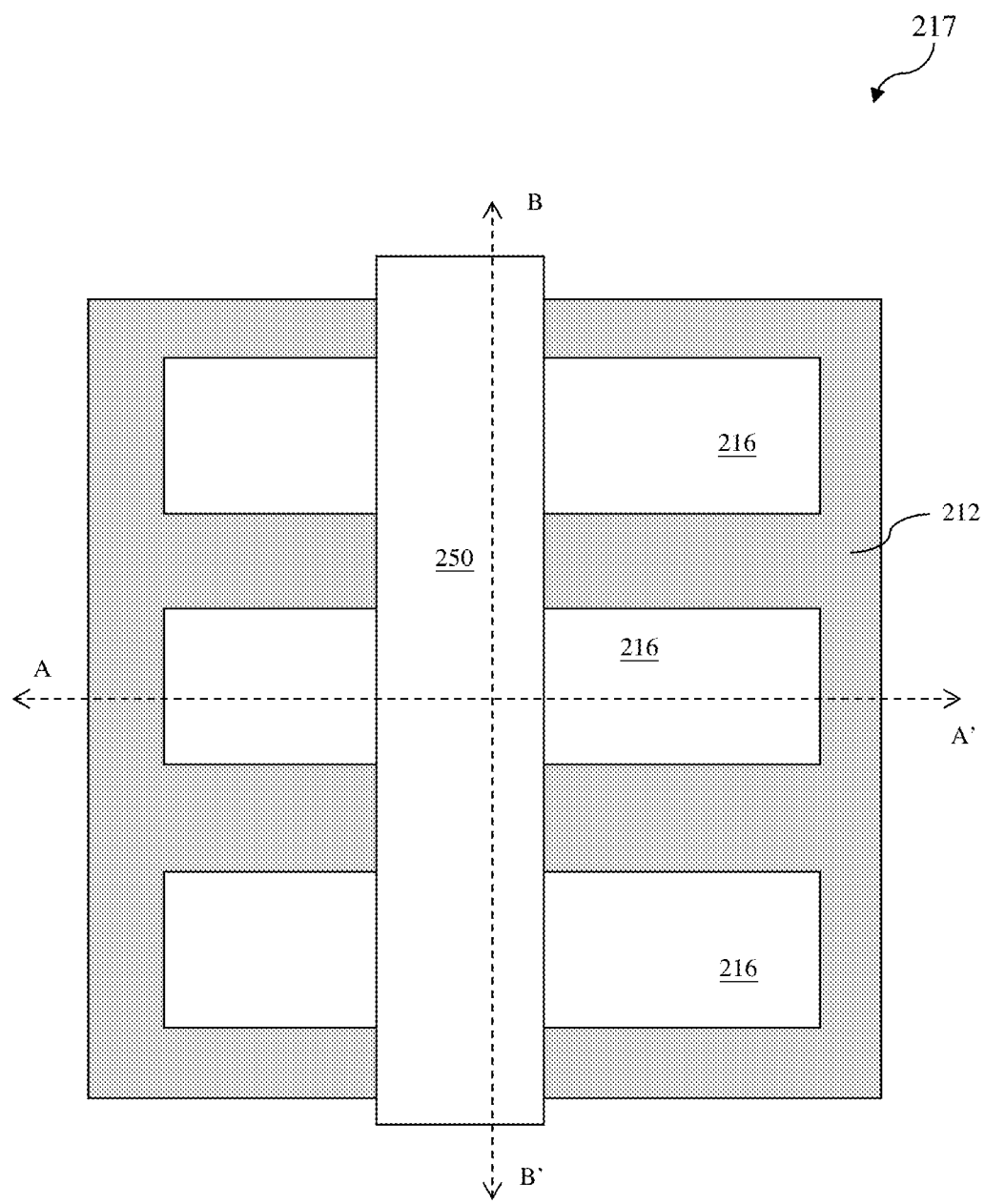
Figure 13C:
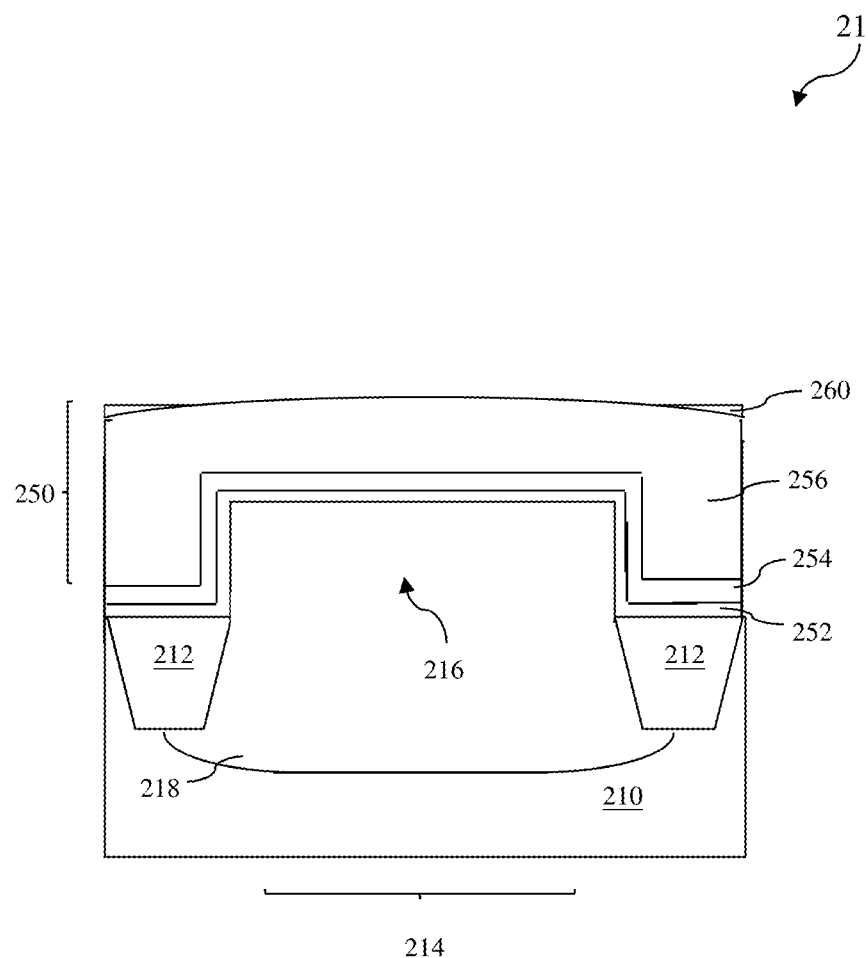

Similarly, after the operation 116, the semiconductor structure 217 fabricated by the method 100 is illustrated in FIGS. 13A-13C as well. FIG. 13B is a top view of the semiconductor structure 217. FIGS. 13A and 13C are sectional views of the semiconductor structure 217 along the dashed lines AA' and BB' of FIG. 12B, respectively. Particularly, the convex gate 250 is disposed on the fin structure 216 and the isolation features 212. The first portion of the gate 250 on the fin structure 216 and the second portion of the gate 250 on the isolation features 212 have respective bottom surfaces at different levels (not coplanar in other words). The top surface of the gate 250 is not plat but has a convex shape such that the capping layer 260 is able to be formed on the edges of the gate 250.

Other processing steps may follow to form a functional circuit. For example, an interconnect structure is formed on the substrate and is designed to couple various transistors and other devices to form a functional circuit. The interconnect structure includes various conductive features, such as metal lines for horizontal connections and contacts/vias for vertical connections. The various interconnect features may implement various conductive materials including copper, tungsten and silicide. In one example, a damascene process is used to form copper-based multilayer interconnect structure. In another embodiment, tungsten is used to form tungsten plug in the contact holes.

Even though only one gate stack 250 is shown in the figures, however, multiple gate stacks with convex top surfaces are formed on the substrate 210 and various corresponding nFETs, pFETs and other circuit devices are formed on the substrate 210. In some embodiments, the gate stack 250 is formed on the 3D fin active region and is a portion a FinFET.

The present disclosure is not limited to applications in which the semiconductor structure includes a filed effect transistor, such as a metal-oxide-silicon (MOS) transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor structure 200 includes FinFET transistors. Of course, aspects of the present disclosure are also applicable and/or readily adaptable to other type of transistor, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metal. The footing procedure may implement other effective cleaning procedure. The disclosed method is used to but not limited to form one transistor, such as an n-type metal-oxide-semiconductor field-effect-transistor (nMOSFET). For example, a plurality of nMOSFETs and a plurality of p-type metal-oxide-semiconductor field-effect-transistors (pMOSFETs) are formed in the same substrate, the nMOSFETs and pMOSFETs are formed in a collective procedure where some features are respectively formed. In a particular example, the n-type WF metal is formed in the nMOSFET regions while pMOSFET regions are covered from the deposition of n metal.

In another embodiment, the semiconductor substrate may include an epitaxial layer. For example, the substrate may have an epitaxial layer overlying a bulk semiconductor. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

The present disclosure provides a semiconductor structure and method making the same. The semiconductor structure includes a gate stack having a convex top surface. Furthermore, a capping layer may be formed on the edge regions of the convex top surface of the gate stack. The capping layer functions as a barrier layer to protect the gate stack from various damages, such as chemical damages, during the subsequent fabrication processes. The formation of the convex gate stack includes a selective removing process, such as a selective CMP or a selective etching process designed to have different etch rates to different metal layers, especially having higher removal rates to edge metal layers and lower removal rates to the central metal layers.

Various advantages may present in one or more embodiments of the method 100, the semiconductor structure 200. The semiconductor structure 200 includes a gate stack 250 having a convex top surface. Furthermore, the capping layer 260 is formed on the convex top surface in the edge areas. The capping layer 260 functions as a barrier layer. For example, during following operation to form contacts, chemical etching is evolved to open the subsequently formed ILD layer. The etching chemical may further etch to the gate stack 250 from the sidewalls and thereby damage it. With the protection of the capping layer 260, the gate stack 250 is protected and is therefore damage free. Accordingly, the device quality is ensured and device performance is improved.

Thus, the present disclosure provides a semiconductor structure. The semiconductor structure includes a semiconductor substrate; and a gate stack disposed on the semiconductor substrate; wherein the gate stack includes a high k dielectric material layer, and various metal layers disposed on the high-k dielectric material layer, wherein the gate stack has a convex top surface.

The present disclosure also provides a semiconductor structure in accordance with some embodiments. The semiconductor structure includes a semiconductor substrate; and a gate stack disposed on the semiconductor substrate. The gate stack includes a gate dielectric layer including a high k dielectric material; a capping layer disposed on the high k dielectric material layer; a work function metal layer disposed over the capping layer; a blocking layer disposed on the work function metal layer; and a filling metal layer disposed on the blocking layer. The gate stack has a convex top surface.

The present disclosure provides a method in accordance with some embodiments. The method includes forming a dummy gate on a semiconductor substrate; forming an interlayer dielectric layer on the substrate; removing the dummy gate, resulting in a gate trench in the interlayer dielectric layer; forming various gate material layers to fill in the gate trench, wherein the gate material layers includes a gate dielectric layer, various metal layers on the capping layer; and performing a selective removing process, thereby forming a gate stack having a convex top surface.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
    a semiconductor substrate; and
    a gate stack disposed on the semiconductor substrate;
    wherein the gate stack includes a high k dielectric material layer, and a plurality of metal layers disposed over the high-k dielectric material layer, wherein the gate stack has a convex top surface that includes a topmost surface of each of the plurality of metal layers.

2. The semiconductor structure of claim 1, wherein the convex top surface of the gate stack has a height difference H and a width W; and a ratio H/W ranges from about 10% to about 50%.

3. The semiconductor structure of claim 2, wherein the height difference H ranges from about 2 nm to about 10 nm.

4. The semiconductor structure of claim 1, further comprising a top capping layer disposed over the convex top surface of the gate stack in edge areas such that a portion of the convex top surface extends through the top capping layer.

5. The semiconductor structure of claim 4, wherein the top capping layer includes a dielectric material selected from the group consisting of silicon oxide, silicon nitride, low-k dielectric material, and a combination thereof.

6. The semiconductor structure of claim 1, wherein the gate stack includes
    an interfacial layer over the semiconductor substrate;
    the high-k dielectric material layer over the interfacial layer;
    a capping layer over the high-k dielectric material layer;
    a work function metal layer disposed over the capping layer;
    a blocking layer over the work function metal layer; and
    a filling metal layer.

7. The semiconductor structure of claim 6, further comprising another blocking layer disposed between the work function metal layer and the capping layer.

8. The semiconductor structure of claim 6, wherein
    the interfacial layer includes silicon oxide;
    the capping layer includes one of titanium nitride and tantalum nitride;
    the blocking layer includes one of titanium nitride and tantalum nitride; and
    the filling metal layer includes one of aluminum and tungsten.

9. A semiconductor structure, comprising:
    a semiconductor substrate; and
    a gate stack disposed over the semiconductor substrate;
    wherein the gate stack includes
    a gate dielectric layer including a high k dielectric material;
    a capping layer disposed over the high k dielectric material layer;
    a work function metal layer disposed over the capping layer;
    a blocking layer disposed over the work function metal layer; and
    a filling metal layer disposed over the blocking layer,
    wherein the gate stack has a convex top surface including a topmost surface of the filling metal layer and a topmost surface of a gate stack layer from a group consisting of the gate dielectric layer, the capping layer, the work function layer, and the blocking layer.

10. The semiconductor structure of claim 9, wherein the convex top surface of the gate stack has a height difference H and a width W; and a ratio H/W ranges from about 10% to about 50%.

11. The semiconductor structure of claim 10, wherein the height difference H ranges from about 2 nm to about 10 nm.

12. The semiconductor structure of claim 9, further comprising a top capping layer disposed over the convex top surface of the gate stack in edge areas such that a portion of the convex top surface extends through the top capping layer.

13. The semiconductor structure of claim 12, wherein the top capping layer includes a dielectric material selected from the group consisting of silicon oxide, silicon nitride, low-k dielectric material, and a combination thereof.

14. A method of forming a semiconductor structure, comprising:
    forming a dummy gate over a semiconductor substrate;
    forming an interlayer dielectric layer over the substrate;
    removing the dummy gate, resulting in a gate trench in the interlayer dielectric layer;
    forming a plurality of gate material layers to fill in the gate trench, wherein the gate material layers include a gate dielectric layer and a plurality of metal layers, and further include a top surface that includes a first material of a first layer of the plurality of gate material layers and a second material of a second layer of the plurality of gate material layers; and
    performing a selective removing process on the top surface wherein the first material of the first layer and the second material of the second layer are removed at different rates, thereby forming a gate stack having a convex top surface that includes a first top surface of the first layer and a second top surface of the second layer.

15. The method of claim 14, wherein the selective removing process includes a selective chemical mechanical polishing (CMP) process, wherein the selective CMP process uses a slurry having chemicals to provide selective removal rates to the plurality of metal layers.

16. The method of claim 14, wherein the selective removing process includes a selective etching process, wherein the selective etching process uses an etchant having selective etching rates to the plurality of metal layers.

17. The method of claim 16, wherein the etchant includes a chemical selected from the group consisting of F2, C12, BCl3, and a combination thereof.

18. The method of claim 14, wherein the forming a plurality of gate material layers includes forming
    a gate dielectric layer including a high k dielectric material;
    a capping layer disposed over the high k dielectric material layer;
    a work function metal layer disposed over the capping layer;
    a blocking layer disposed over the work function metal layer; and
    a metal layer disposed over the blocking layer.

19. The method of claim 14, further comprising forming a top capping layer over the convex top surface of the gate stack in edge areas, wherein the forming of the top capping layer includes depositing a dielectric layer over the substrate and the gate stack; and performing a chemical mechanical polishing process to the top capping layer such that the first top surface of the first layer extends through the top capping layer.

20. The method of claim 19, wherein the depositing of the top capping layer includes depositing a dielectric material layer selected from the group consisting of silicon oxide, silicon nitride, low-k dielectric material, and a combination thereof.

* * * * *